United States Patent [19]

Kobayashi et al.

[11] 4,313,310

[45] Feb. 2, 1982

[54] COOLING SYSTEM

[75] Inventors: Kyoji Kobayashi, Sagamihara; Takaichi Kosaka, Hino; Sigeki Takahara, Kawasaki; Akira Tamura, Chiba, all of Japan

[73] Assignees: Fujitsu Limited; Fuji Kaden Co., Ltd., both of Japan

[21] Appl. No.: 183,736

[22] Filed: Sep. 3, 1980

[30] Foreign Application Priority Data

Sep. 7, 1979 [JP] Japan .................................. 54-115003

[51] Int. Cl.³ .................. F25B 39/04; F25B 25/00
[52] U.S. Cl. ........................................ 62/175; 62/183; 62/332
[58] Field of Search .............. 62/185, 183, 332, 260, 62/305, 175

[56] References Cited

U.S. PATENT DOCUMENTS

| | | | |
|---|---|---|---|
| 2,048,661 | 7/1936 | Lawler | 62/332 X |
| 2,167,878 | 8/1939 | Drawford | 62/185 X |
| 2,279,657 | 4/1942 | Crawford | 62/185 X |
| 4,107,942 | 8/1978 | Fairman | 62/305 |

Primary Examiner—William E. Wayner
Attorney, Agent, or Firm—Staas & Halsey

[57] ABSTRACT

A cooling system utilizing cold outdoor air and water for cooling high heat generating equipment such as a computer. The system includes a cold water coil and a cold water switching valve in addition to an ordinary air conditioning apparatus. When the outdoor temperature is sufficiently low, the water is routed through the cold water coil instead of a condensor, and the room air is cooled directly by the cold water.

8 Claims, 6 Drawing Figures

COOLING SYSTEM

BACKGROUND OF THE INVENTION

1. Field of the Invention

This invention relates to a system, for cooling by outdoor air and cold water, which is suitable for cooling a system generating much heat such as an electronic computer (hereinafter referred to as a computer) or a room in which such a computer is installed, in order to realize an energy savings through the effective use of cold outdoor air.

2. The Prior Art

The recent increase in the number of data processing systems such as the computer has given rise to systems which are high in heat generation density due to the heat generated from the large number of semiconductor elements as the operation rate is much improved and a higher accommodation density is realized. While the heat generation density of an ordinary working office is 10 to 30 kcal/hm$^2$, that of a computer room is usually as high as 100 to 150 kcal/hm$^2$. In some cases, it reaches 500 kcal/hm$^2$ depending on the system layout.

Even in winter with a low outdoor temperature, the amount of heat leaked through the building to the outside is only 1/5 to 1/10 of that generated from computer equipment and therefore the computer room is always cooled, even in mid-winter, to the specified room temperature by operating the cooling system. Moreover, in practice, re-heating, which works against the surplus cooling capability, is attempted by means of an electric heater in order to make the temperature regulation smooth. For this reason, it is completely unreasonable, from an energy saving point of view, to conduct air cooling in the room in mid-winter.

SUMMARY OF THE INVENTION

An object of this invention is to provide a very economical cooling system using outdoor air and cold water which avoids the unreasonable use of energy and uses in its place, cold outdoor air.

The invention will be explained in detail by referring to the accompanying drawings wherein like numerals refer to like parts throughout.

DETAILED DESCRIPTION OF THE PREFERRED EMBODIMENTS

Figures 1, 1A:
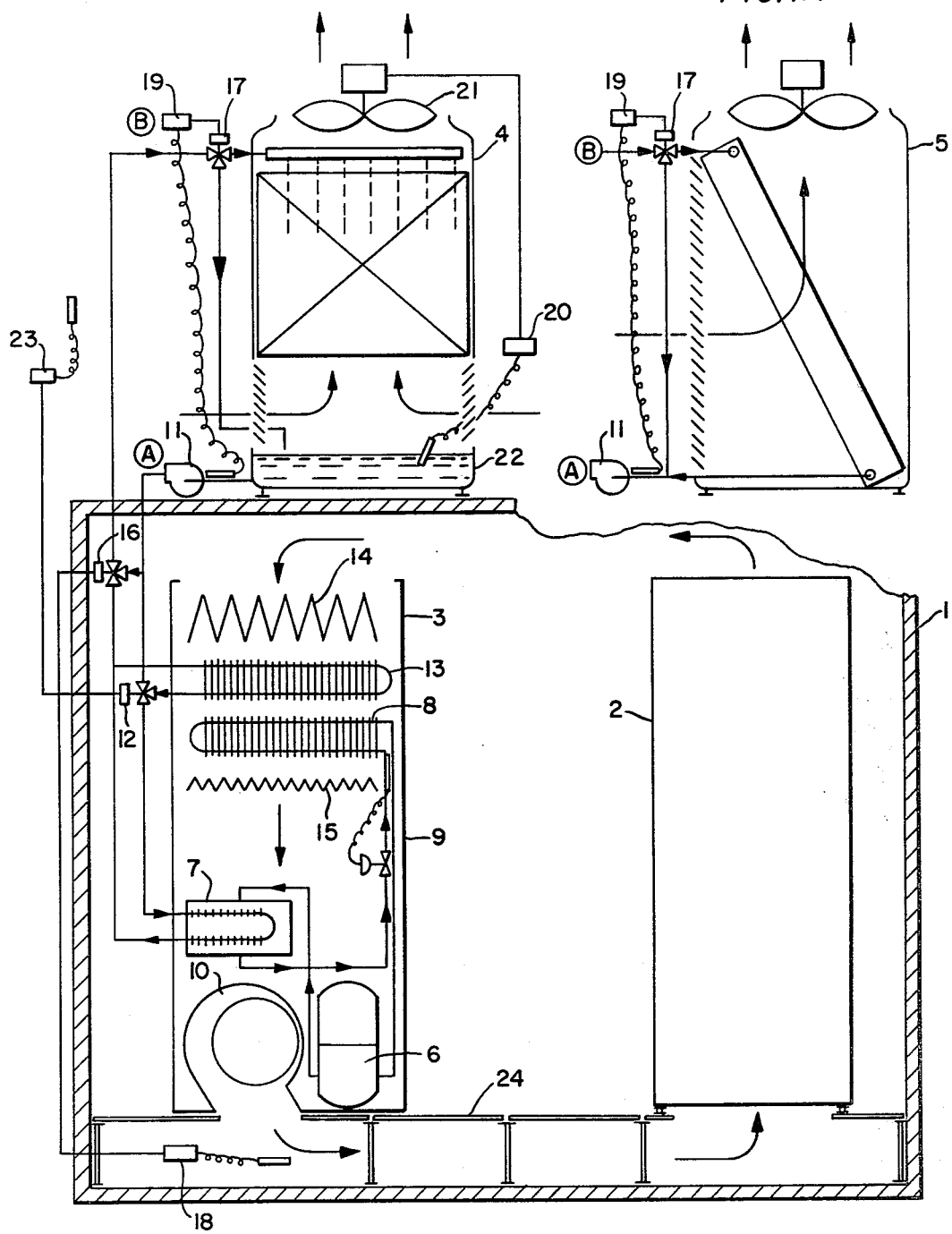
FIG. 1 is a schematic illustration of an embodiment of the present invention.
FIG. 1A is a schematic illustration of an alternate embodiment of the pressent invention.

In FIGS. 1 and 1a, numeral 1 denotes a computer room; 2, a computer; 3, an air conditioning apparatus; 4, an outdoor cooling tower; 5, a water cooling coil; 6, a compressor; 7, a condensor; 8, an evaporator; 9, an expansion valve (or capillary tube); 10, a blower; 11, a pump. This portion of the system is the same as existing systems.

In the present invention, however, a cold water switching valve 12 and a cold water coil 13 are added. When the outdoor air is cold, the compressor 6 stops operation and the cold water supplied from the cooling tower 4 is sent to the cold water coil 13 instead of the condenser 7 through the cold water switching valve 12. In FIG. 1, 14 is an air filter and 15 is a re-heating electric heater.

The operation of the system will now be explained in detailed. First, when the outdoor air temperature is not sufficiently low, the ordinary cooling operation is performed. Namely, the refrigerant (freon gas etc.) compressed by the compressor 6 is cooled and liquified by the condensor 7. The liquified refrigerant is subjected to a pressure reduction by the expansion valve (or capillary tube) 9 and enters the evaporator 8. The air in the room which is circulated by the blower 10 through the air filter 14 is cooled by the heat of evaporization of the refrigerant as it passes the evaporator 8. The refrigerant evaporated in the evaporator 8 enters the compressor 6, is compressed again, and the above operation is restarted. On the other hand, in the cooling tower 4, coolant water is dropped in the form of a shower is cooled by both the cold air and by its own heat, of evaporation (the latent heat) and circulates through the condensor 7 by means of the pump 11. When the outdoor air temperature is sufficiently low (the conditions will be explained later), the cold water which has been supplied to the condenser 7 is instead supplied to the cold water coil 13 and the compressor 6 stops operation. Thus, the room is directly cooled by the cold water coil 13. As a result, the power which is required for driving the compressor 6 and the re-heating heater 15 can be saved, and very efficient cooling by the cold water is realized.

If the water cooling coil 5 is used instead of the cooling tower 4, the same operation as mentioned above is performed except that the water is cooled through the exchange of heat with the outdoor air.

When the cooling tower is used, the wet bulb temperature of the outdoor air must be lower than the room temperature by 10° to 16° C. in order to use the cold water cooling. When the water cooling coil is used, the dry bulb temperature of the outdoor air must also be lower than the room temperature by 10° to 16° C.

Next, the temperature regulation mechanism for the outdoor air cooling disclosed in this invention will be explained. In FIG. 1, 16 and 17 are three-way valves for bypass; 18, 19 and 20 are temperature detectors; 21 is a blower for the cooling tower 4. If the room is excessively cooled and the air temperature blown out from the air conditioning apparatus 3 is too low, the three-way valve 16 by-passes the cold water by means of a signal from the temperature detector 18. In this manner, the amount of cold water to be sent to the cold water coil 13 is adjusted, thereby maintaining the temperature of the air blown from the air conditioning apparatus 3 at a specified value. In order to prevent excessive cooling of the cold water, the temperature of the cold water in the cooling tower 4 is detected by the temperature detector 20 and, if the water is excessively cooled, the blower 21 is turned off. In addition, the three-way valve 17 may be adjusted by a signal sent from the temperature detector 19 so that the cold water may be bypassed to the water tank 22 of the cooling tower 4. If the water cooling coil 5 is used, temperature regulation can be accomplished in the same way.

The switching of the switching valve 12 can be done automatically by means of the regulator 23 which detects the conditions of the outdoor air, i.e. the temperature and the humidity.

As explained above, the present invention is especially significant in view of energy savings obtained because the compressor 6 and the re-heating heater 15 are not used in the winter and the system directly performs the cooling with cold water.

Figure 2:
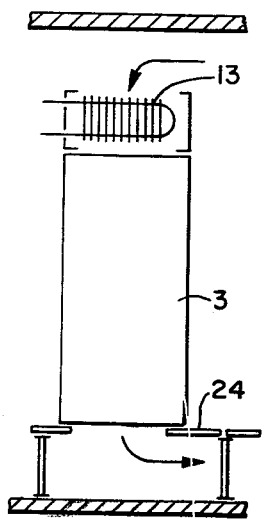
FIGS. 2 to 5 are schematic illustrations of the principle part of alternate embodiments of the present invention.
Figure 3:
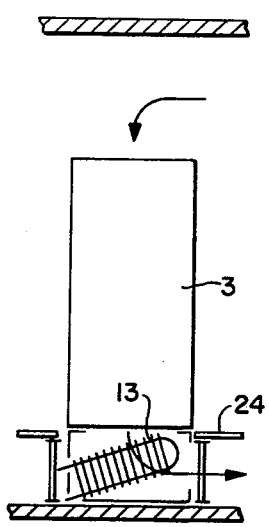
Figure 4:
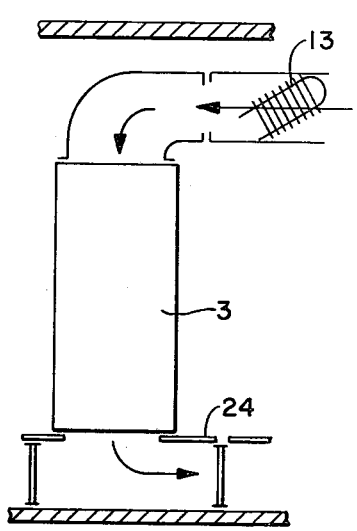
Figure 5:
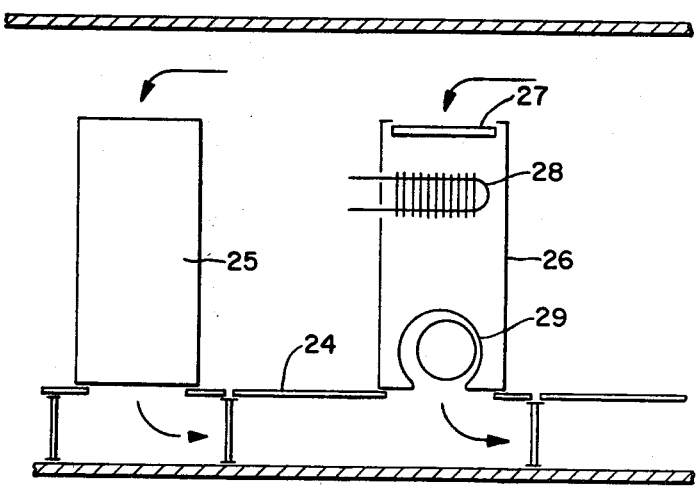

The cold water coil 13 can be built in the air conditioning apparatus as shown in FIG. 1 and also it can be mounted as an attachment to the suction port or discharge port of existing air conditioning apparatus as illustrated in FIGS. 2 to FIG. 4. In addition, as illustrated in FIG. 5, a blower 29 can be built in a locker 26, with a cold water coil 28 and used with an existing cooling system 25 as a completely independent cooling system. In FIG. 5 27 is an air filter and 24 is a free access floor.

The many features and advantages of the invention are apparent from the detailed specification and thus it is intended by the appended claims to cover all such features and advantages of the system which fall within the true spirit and scope of the invention. Further, since numerous modifications and changes will readily occur to those skilled in the art, it is not desired to limit the invention to the exact construction and operation shown and described, and accordingly all suitable modifications and equivalents may be resorted to, falling within the scope of the invention.

What we claim:

1. A cooling system comprising:
   air conditioning apparatus comprising:
      a compressor;
      a condensor;
      means for connecting said compressor and condensor;
      an evaporator;
      means for connecting said evaporator to said condensor and said compressor; and
      a blower for blowing air passing over said condensor;
   an outdoor cooling tower operatively connected to said condensor, for cooling and circulating cold water in a circulation path to and from said condensor;
   a cold water switching valve operatively connected in said cold water circulation path; and
   a cold water coil connected to said cold water circulation path through said cold water switching valve;
   said cold water switching valve selectively switching said cold water circulation path to one of said condensor and said cold water coil in accordance with the temperature of the outdoor air.

2. A cooling system comprising:
   air conditioning apparatus comprising:
      a compressor;
      a condensor operatively connected to said compressor;
      an evaporator operatively connected to said condensor and said compressor; and
      a blower positioned to blow the air passing over said condensor;
   an outdoor water cooling coil, operatively connected to said condensor, for cooling and circulating cold water in a circulation path to and from said condensor;
   a cold water switching valve operatively connected in said cold water circulation path; and
   a cold water coil connected to said cold water circulation path through said cold water switching valve;
   said cold water switching valve selectively switching said cold water circulation path to one of said condensor and said cold water coil in accordance with the temperature of the outdoor air.

3. The cooling system as set forth in claim 3 or 4, further comprising sensor means, operatively connected to said cold water switching valve, for sensing the temperature of the outdoor air and for selectively actuating said cold water switching valve.

4. The cooling system as set forth in claim 5, further comprising a bypass valve operatively connected in said cold water circulation path; and
   second sensor means, operatively connected to said bypass valve, for sensing the temperature of the air blown by said blower and for selectively actuating said bypass valve to discontinue the flow of cold water to said cold water coil and said condensor.

5. The cooling system as set forth in claim 3 or 4 wherein said blower blows the air passing over said cold water coil and said condensor through a computer to cool the computer.

6. A cooling system comprising:
   air conditioning apparatus including a compressor, a condensor operatively connected to said compressor, an expansion valve operatively connected to said condensor, an evaporator operatively connected to said expansion valve and said compressor, and a blower for blowing cooled air;
   an outdoor watercooling coil, operatively connected to said condensor, for cooling and circulating cold water in a circulation path to and from said condensor;
   a cold water switching valve operatively connected in said cold water circulation path; and
   a cold water coil connected to said cold water circulation path through said cold water switching valve.

7. A cooling system comprising:
   air conditioning apparatus including a compressor, a condensor operatively connected to said compressor, an expansion valve operatively connected to said condensor, an evaporator operatively connected to said expansion valve and said compressor, and a blower for blowing cooled air;
   an outdoor cooling tower, operatively connected to said condensor, for cooling and circulating cold water in a circulation path to and from said condensor;
   a cold water switching valve operatively connected in said cold water circulation path; and
   a cold water coil connected to said cold water circulation path through said cold water switching valve.

8. The cooling system as set forth in claim 8 or 9, wherein said cold water switching valve selectively switches said cold water circulation path to one of said condensor and said cold water coil in accordance with the temperature of the outdoor air.

* * * * *

UNITED STATES PATENT AND TRADEMARK OFFICE
CERTIFICATE OF CORRECTION

PATENT NO. : 4,313,310
DATED : February 2, 1982
INVENTOR(S) : KYOJI KOBAYASHI ET AL.

It is certified that error appears in the above—identified patent and that said Letters Patent is hereby corrected as shown below:

```
Front page, [56] References Cited,
          line  4, "Drawford" should be --Crawford--.
Column 1, line 41, after "uses" insert --,--;
          line 52, "ple" should be --pal--;
          line 57, "la" should be --1A--.
Column 2, line  5, "detailed" should be --detail--;
          line 13, "evaporization" should be --evaporation--;
          line 18, after "shower" insert --,--;
          line 20, after "heat)" insert --,--.
Column 3, line 12, "527" should be --5, 27--.
Column 4, line 10, "3 or 4" should be --1 or 2--;
          line 15, "5" should be --3--;
          line 23, "3 or 4" should be --1 or 2--;
          line 59, "8 or 9" should be --6 or 7--.
```

Signed and Sealed this

First Day of June 1982

[SEAL]

Attest:

GERALD J. MOSSINGHOFF

Attesting Officer     Commissioner of Patents and Trademarks